US005357227A

United States Patent [19]

Tonegawa et al.

[11] Patent Number: 5,357,227

[45] Date of Patent: Oct. 18, 1994

[54] LAMINATED HIGH-FREQUENCY LOW-PASS FILTER

[75] Inventors: Ken Tonegawa; Hisatake Okamura, both of Nagaokakyo, Japan

[73] Assignee: Murata Mfg. Co., Ltd., Japan

[21] Appl. No.: 48,381

[22] Filed: Apr. 16, 1993

[30] Foreign Application Priority Data

Apr. 16, 1992 [JP] Japan .................. 4-124177
Apr. 16, 1992 [JP] Japan .................. 4-124178
Dec. 17, 1992 [JP] Japan .................. 4-355743

[51] Int. Cl.[5] .................. H03H 7/00
[52] U.S. Cl. .................. 333/185; 333/204
[58] Field of Search .................. 333/202-205, 333/185, 175

[56] References Cited

U.S. PATENT DOCUMENTS 2,915,716 12/1959 Hattersley .................. 333/204
2,945,195 7/1960 Matthaei .................. 333/204
3,451,015 6/1969 Heath .................. 333/204 X
3,879,690 4/1975 Golant et al. .................. 333/204
5,075,650 12/1991 Okamura et al. .................. 333/177
5,140,497 8/1992 Kato et al. .................. 333/202 X

FOREIGN PATENT DOCUMENTS 3254512 11/1991 Japan .................. 333/219

*Primary Examiner*—Seungsook Ham
*Attorney, Agent, or Firm*—Ostrolenk, Faber, Gerb & Soffen

[57] ABSTRACT

A laminated high-frequency low-pass filter includes a first dielectric layer. A second dielectric layer, a third dielectric layer, a fourth dielectric layer, and a fifth dielectric layer are laminated on the first dielectric layer. An earth electrode is formed on the first dielectric layer. A first capacitive open-circuited stub electrode, a second capacitive open-circuited stub electrode and a third capacitive open-circuited stub electrode are formed on the second dielectric layer. A first strip line electrode and a second strip line electrode are formed on the third dielectric layer. The first and second strip line electrodes are formed as meander lines. A shield electrode is formed on the fourth dielectric layer.

10 Claims, 16 Drawing Sheets

LAMINATED HIGH-FREQUENCY LOW-PASS FILTER

BACKGROUND OF THE INVENTION

1. Field of the Invention

The present invention relates to a high-frequency low-pass filter and more particularly to a high-frequency low-pass filter having a strip line electrode for use as an inductor.

2. Description of the Prior Art

FIG. 15 is a perspective view showing an example of a conventional high-frequency low-pass filter. The high-frequency low-pass filter 1 shown in FIG. 15 includes a dielectric substrate 2 having first and second main surfaces. On the entire surface of the first main surface of the dielectric substrate 2, an earth electrode 3 is formed. In the center of the second main surface of the dielectric substrate 2, two microstrip line electrodes 4*a* and 4*b* forming first and second inductors are located. Furthermore, on the second main surface of the dielectric substrate 2, a first capacitive open-circuited stub electrode 5*a* forming a part of a first capacitor and an input electrode 6*a* forming an input terminal extend from end of one microstrip line electrode 4*a*. A second capacitive open-circuited stub electrode 5*b* forming part of a second capacitor extends from the other end of microstrip line electrode 4*a* and one end of the other microstrip line electrode 4*b*. A third capacitive open-circuited stub electrode 5*c* forming part of a third capacitor and an output electrode 6*b* as an output terminal extend from the other end of the other microstrip line electrode 4*b*.

FIG. 16 is a perspective view showing another example of a conventional high-frequency low-pass filter. Compared with the high-frequency low-pass filter shown in FIG. 15, in the high-frequency low-pass filter 1 shown in FIG. 16, three chip capacitors 7*a*, 7*b* and 7*c* instead of three capacitive open-circuited stub electrodes are used.

The high-frequency low-pass filters 1 shown in FIG. 15 and FIG. 16 have an equivalent circuit shown in FIG. 17 in a form of a concentrated constant. That is, the high-frequency low-pass filters 1 shown in FIG. 15 and FIG. 16 have an input terminal IN and an output terminal OUT. Between the input terminal IN and the output terminal OUT, the first and the second inductors $L_1$ and $L_2$ are connected in series. Furthermore, the input terminal IN is grounded through the first capacitor $C_1$, the connecting point between the first and the second inductors $L_1$ and $L_2$ is grounded through the second capacitor $C_2$, and the output terminal OUT is grounded through the third capacitor $C_3$.

In the conventional examples shown in FIG. 15 and FIG. 16, when a stray capacitance between the earth electrode and the microstrip line electrode is increased, an inductive impedance between both ends of the microstrip line electrode is decreased. Consequently, it is difficult to miniaturize and adapt in a lower frequency.

Furthermore, in the conventional examples shown in FIG. 15 and FIG. 16, when the stray capacitance between the earth electrode and the microstrip line electrode is increased, a frequency by which the impedance between both ends of the microstrip line electrode turns into a capacitive impedance is decreased. Consequently, it is difficult to adapt in a higher frequency.

Also, in the conventional examples shown in FIG. 15 and FIG. 16, an unnecessary passband is generated by resonance in the frequency of the wavelength $$\lambda = (2L\sqrt{\epsilon_r})/N$$

wherein L is the line length of the microstrip line electrode, $\epsilon_r$ is the relative dielectric constant around the microstrip line electrode, and N is an integral number. Therefore, a good spurious characteristic is not obtained.

SUMMARY OF THE INVENTION

Therefore, it is a primary object of the present invention to provide a high-frequency low-pass filter having a good spurious characteristic.

A high-frequency low-pass filter according to the present invention is a high-frequency low-pass fitter comprising a strip line electrode used as an inductor, a capacitive open-circuit stub electrode connected to the strip line electrode, and a capacitor formed between the strip line electrode and the capacitive open-circuited stub electrode and connected to the inductor in parallel, wherein the parallel resonance frequency between the inductor and the capacitor is approximately equal to the frequency of the wavelength of $$\lambda = 2L\sqrt{\epsilon_r}$$

wherein L is the line length of the strip line electrode, and $\epsilon_r$ is the relative dielectric constant around the strip line electrode.

In the high-frequency low-pass filter according to the present invention, since the parallel resonance frequency between the inductor and the capacitor is approximately equal to the frequency of the wavelength $$\lambda = 2L\sqrt{\epsilon_r}$$

wherein L is the line length of the strip line electrode, and $\epsilon_r$ is the relative dielectric constant around the strip line electrode, an unnecessary passband caused by resonance in the frequency of the wavelength $$\lambda = (2L\sqrt{\epsilon_r})/N$$

wherein N is an integral number is suppressed. Thus, a spurious characteristic is improved.

According to the present invention, a high-frequency low-pass filter having a good spurious characteristic is obtained.

Also, in the high-frequency low-pass filter according to the present invention, since the strip line electrode is used as the inductor and the capacitive open-circuited stub electrode is used, it can be formed in a laminated structure. Therefore, it can be miniaturized, and manufactured as a surface mountable device.

It is another object of the present invention to provide a high-frequency low-pass filter which suppresses the generation of a spurious response and has a preferable frequency characteristic.

Another high-frequency low-pass filter according to the present invention is a high-frequency low-pass filter comprising a first dielectric layer, an earth electrode formed on the first dielectric layer, a second dielectric layer formed on the first dielectric layer and sandwiching the earth electrode between the first dielectric layer and the second dielectric layer, a capacitive open-circuited stub electrode formed on the second dielectric layer and opposite to the earth electrode, a third dielectric layer formed on the second dielectric layer and sandwiching the capacitive open-circuited stub electrode between the second dielectric layer and the third dielectric layer, and two strip line electrodes formed on the third dielectric layer and connected to the capacitive open-circuited stub electrode, wherein the surface areas of the two strip line electrodes are different from each other.

In another high-frequency low-pass filter, a capacitance is formed between the earth electrode and the capacitive open-circuited stub electrode. Furthermore, two inductances are formed by the two strip line electrodes. The high-frequency low-pass filter is made by the inductances and the capacitance. In the high-frequency low-pass filter, since the surface areas of the two strip line electrodes are different from each other, a capacitance formed between one strip line electrode and other electrodes is different from a capacitance formed between the other strip line electrode and the other electrodes. Consequently, resonance points generated in a high frequency band are different each other and hence do not overlap with each other.

According to the present invention, since resonance points generated in a high frequency band are different from each other and hence do not overlap with each other, a great spurious response is not generated. Accordingly, the high-frequency low-pass filter provides a preferable frequency characteristic.

The above and further objects, features and advantages of the present invention will be more fully apparent from the following detailed description of the embodiments with accompanying drawings.

DESCRIPTION OF THE PREFERRED EMBODIMENTS

Figure 1:
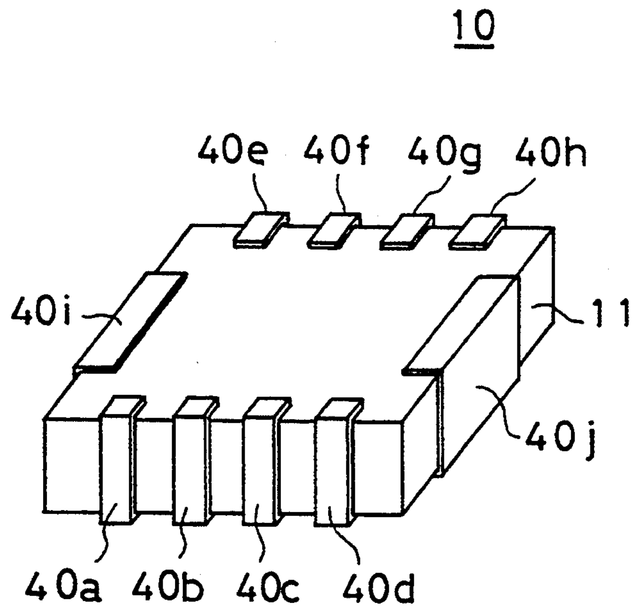
FIG. 1 is a perspective view showing a high-frequency low-pass filter according to an embodiment of the present invention.

FIG. 1 is a perspective view showing a high-frequency low-pass filter according to an embodiment of the present invention. The high-frequency low-pass filter 10 includes a laminate 11 which is, for example, 5.7 mm wide, 5.0 mm long, and 2.0 mm thick.

Figure 2:
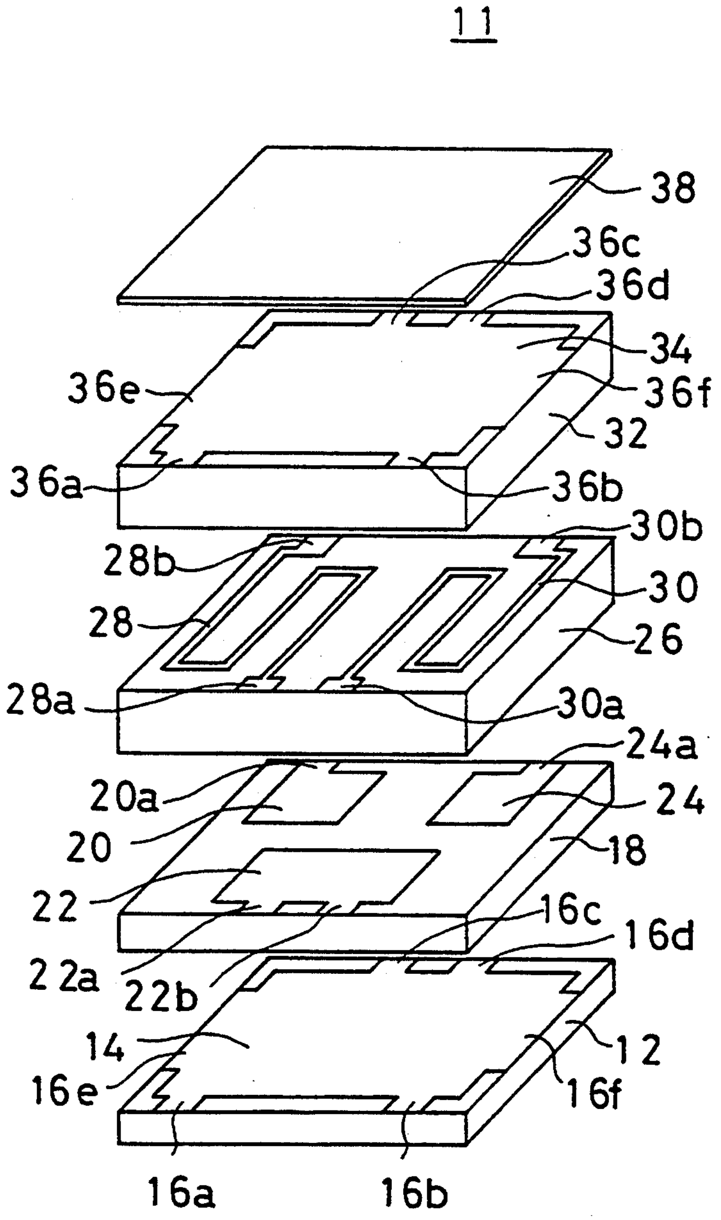
FIG. 2 is an exploded perspective view showing a laminate of the high-frequency low-pass filter of FIG. 1.

As shown in FIG. 2, the laminate 11 includes a first dielectric layer 12. An earth electrode 14 is formed on the entire surface of the first dielectric layer 12 except on the periphery thereof. Six drawing terminals 16a, 16b, 16c, 16d, 16e and 16f are formed to extend from the earth electrode 14 toward the edges of the first dielectric layer 12. The drawing terminals 16a and 16b are formed to extend from the earth electrode 14 toward one edge of the first dielectric layer 12 with a space formed between the drawing terminals 16a and 16b. The drawing terminals 16c and 16d are formed in the direction from the earth electrode 14 toward the opposite edge of the first dielectric layer 12 with a short space formed between both drawing terminals 16c and 16d in the vicinity of the center of the edge. The drawing terminals 16e and 16f are formed to extend from the earth electrode 14 toward the another opposite edges of the first dielectric layer 12.

A second dielectric layer 18 is laminated on the earth electrode 14. A first capacitive open-circuited stub electrode 20, a second capacitive open-circuited stub electrode 22 and a third capacitive open-circuited stub electrode 24 which comprise a part of first, second and third capacitors are formed on the second dielectric layer 18. The second capacitive open-circuited stub electrode 22 is formed in the vicinity of the center of one edge of the second dielectric layer 18. The first capacitive open-circuited stub electrode 20 and the third capacitive open-circuited stub electrode 24 are formed in the vicinity of the other edge of the second dielectric layer 18 with a space formed therebetween. The first, second, and third capacitive open-circuited stub electrodes 20, 22, and 24 are located opposite to the earth electrode 14. Two connecting terminals 22*a* and 22*b* are formed to extend from the second capacitive open-circuited stub electrode 22 toward one edge of the second dielectric layer 18. The connecting terminals 22*a* and 22*b* are formed in the vicinity of the center of the edge of the second dielectric layer 18 with a short space formed therebetween. Connecting terminals 20*a* and 24*a* are formed to extend from the first and third capacitive open-circuited stub electrodes 20 and 24 toward the other edge of the second dielectric layer 18 with a space formed therebetween.

A third dielectric layer 26 is laminated on the first, second and third capacitive open-circuited stub electrodes 20, 22 and 24. A first strip line electrode 28 and a second strip line electrode 30 which are used as first and second inductors are formed on the third dielectric layer 26. The first and second strip line electrodes 28 and 30 are formed as meander lines to extend from one edge of the third dielectric layer 26 toward the other edge thereof. In this case, a portion of the first strip line electrode 28 is formed opposite to the first and the second capacitive open-circuited stub electrodes 20 and 22, for forming a capacitor which is parallel and resonated with the inductor of the first strip line electrode 28. Furthermore, a portion of the second strip line electrode 30 is formed opposite to the second and the third capacitive open-circuited stub electrodes 22 and 24, for forming a capacitor which is parallel and resonated with the inductor of the second strip line electrode 30. One end 28*a* of the first strip line electrode 28 is formed at a position corresponding to the position of the connecting terminal 22*a* of the second capacitive open-circuited stub electrode 22, and the other end 28*b* of the first strip line electrode 28 is formed at a position corresponding to the position of the connecting terminal 20*a* of the first capacitive open-circuited stub electrode 20. One end 30*a* of the second strip line electrode 30 is formed at a position corresponding to the position of the connecting terminal 22*b* of the second capacitive open-circuited stub electrode 22, and the other end 30*b* of the second strip line electrode 30 is formed at a position corresponding to the position of the connecting terminal 24*a* of the third capacitive open-circuited stub electrode 24.

A fourth dielectric layer 32 is laminated on the first strip line electrode 28 and the second strip line electrode 30. A shield electrode 34 is formed on the entire surface of the fourth dielectric layer 32 except on the periphery thereof. Six drawing terminals 36*a*, 36*b*, 36*c*, 36*d*, 36*e* and 36*f* are formed to extend from the shield electrode 34 toward edges of the fourth dielectric layer 32. The drawing terminals 36*a* and 36*b* are formed to extend from the shield electrode 34 toward one edge of the fourth dielectric layer 32 with a space formed therebetween. The drawing terminals 36*c* and 36*d* are formed to extend from the shield electrode 34 toward the other edge of the fourth dielectric layer 32 with a short space formed therebetween in the vicinity of the center of the edge. The drawing terminals 36*e* and 36*f* are formed to extend from the shield electrode 34 toward the other opposite edges of the fourth dielectric layer 32. A fifth dielectric layer 38 is laminated on the shield electrode 34.

Ten outer electrodes 40*a*, 40*b*, 40*c*, 40*d*, 40*e*, 40*f*, 40*g*, 40*h*, 40*i*, and 40*j* are formed on sides of the laminate 11 as shown in FIG. 1. The four outer electrodes 40*a*–40*d* are formed on one side of the laminate 11 while the other four outer electrodes 40*e*–40*h* are formed on the other side thereof. The outer electrodes 40*i* and 40*j* are formed on the remaining two opposite sides of the laminate 11. The outer electrodes 40*a*–40*j* are formed to extend from the upper surface to the lower surface via the side surface of the laminate 11.

The outer electrodes 40*a*, 40*d*, 40*f*, 40*g*, 40*i* and 40*j* are connected to the drawing terminals 16*a*, 16*b*, 16*c*, 16*d*, 16*e* and 16*f* of the earth electrode 14 respectively, and connected to the drawing terminals 36*a*, 36*b*, 36*c*, 36*d*, 36*e* and 36*f* of the shield electrode 34 respectively. The outer electrode 40*b* is connected to one end 28*a* of the first strip line electrode 28 and the connecting terminal 22*a* of the second capacitive open-circuited stub electrode 22. The outer electrode 40*e* is connected to the other end 28*b* of the first strip line electrode 28 and the connecting terminal 20*a* of the first capacitive open-circuited stub electrode 20. The outer electrode 40c is connected to one end 30*a* of the second strip line electrode 30 and the connecting terminal 22*b* of the second capacitive open-circuited stub electrode 22. The outer electrode 40*h* is connected to the other end 30*b* of the second strip line electrode 30 and the connecting terminal 24*a* of the third capacitive open-circuited stub electrode 24.

The high-frequency low-pass filter 10 is formed as follows: Electrode paste is applied to each dielectric ceramic green sheet in the configuration of each electrode and each terminal and baked with dielectric ceramic green sheets laminated one on the other. At this time, the number of the ceramic green sheets is adjusted according to the thickness of each dielectric layer. In order to form the outer electrodes, the raw laminate on which the electrode paste has been applied is baked together, or the sintered laminate on which the electrode paste is applied is baked.

Figure 3:
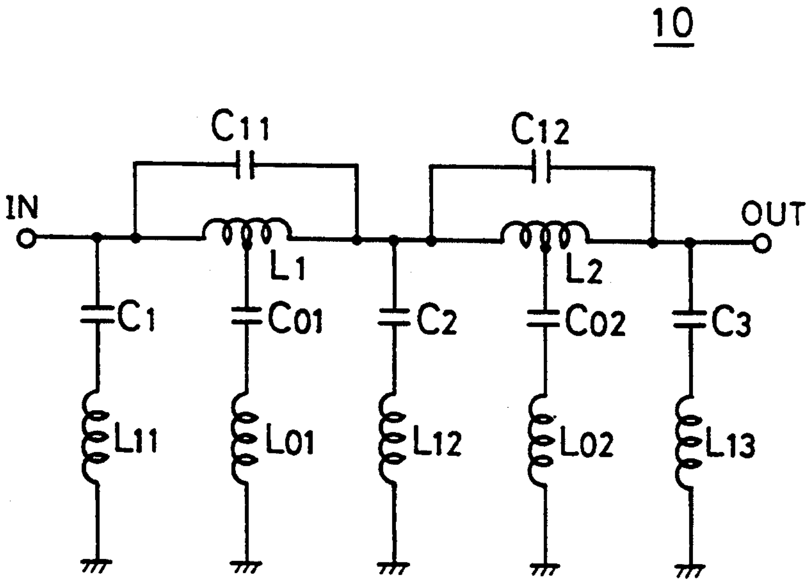
FIG. 3 is an equivalent circuit diagram of the high-frequency low-pass filter of a FIG. 1 in a form of concentrated constant.

As shown in FIG. 3, the high-frequency low-pass filter 10 has an equivalent circuit comprising first and second inductors $L_1$ and $L_2$ and first, second, and third capacitors $C_1$, $C_2$, and $C_3$ connected with each other in a ladder-type arrangement. Between the first, the second and the third capacitors $C_1$, $C_2$ and $C_3$ and the earth potential, parasitic inductances $L_{11}$, $L_{12}$ and $L_{13}$ based on the earth electrode 14 and so on are generated, respectively.

Also, in the high-frequency low-pass filter 10, between the first inductor $L_1$ and the earth electrode 14, a stray capacitance $C_{01}$ and a parasitic inductance $L_{01}$ are generated in series, between the second inductor $L_2$ and the earth electrode 14, a stray capacitance $C_{02}$ and a parasitic inductance $L_{02}$ are generated in series. The stray capacitance $C_{01}$ is generated between the first strip line electrode 28 and other electrodes such as the earth electrode 14 and the shield electrode 34. Similarly, the stray capacitance $C_{02}$ is generated between the second strip line electrode 30 and other electrodes such as the earth electrode 14 and the shield electrode 34.

Furthermore, in the high-frequency low-pass filter 10, a capacitor $C_{11}$ is connected to the first inductor $L_1$ in parallel and a capacitor $C_{12}$ is connected to the second inductor $L_2$ in parallel.

In this case, the capacitance of one capacitor $C_{11}$ is selected so as to approximately coincide with the parallel resonance frequency between the first inductor $L_1$ and the capacitor $C_{11}$ at the frequency of the wavelength $$\lambda = 2L\sqrt{\epsilon_r}$$

wherein L is the line length of the first inductor $L_1$ (the first strip line electrode 28), and $\epsilon_r$ is the relative dielectric constant around the first strip line electrode 28. Also, the capacitance of the other capacitor $C_{12}$ is selected so as to approximately coincide with the parallel resonance frequency between the second inductor $L_2$ and the capacitor $C_{12}$ at the frequency on the wavelength $$\lambda = 2L\sqrt{\epsilon_r}$$

wherein L is the line length of the second inductor $L_2$ (the second strip line electrode 30), and $\epsilon_r$ is the relative dielectric constant around the second strip line electrode 30.

Therefore, in the high-frequency low-pass filter 10, unnecessary passbands caused by resonance in the frequencies on the wavelengths of $$\lambda = (2L\sqrt{\epsilon_r})/N$$

associated with the first and the second strip line electrodes 28 and 30 wherein N is an integral number are suppressed, the spurious characteristic is good.

The capacitance of the capacitor $C_{11}$ can be controlled by changing the thickness of the third dielectric layer 26, an opposite surface area or an opposite distance between the first and the second capacitive open-circuited stub electrodes 20 and 22 and the first strip line electrode 26. When the thickness of the third dielectric layer 28 is thin, the capacitance is great. When the opposite surface area between the first and the second capacitive open-circuited stub electrodes 20 and 22 and the first strip line electrode 28 is great, the capacitance is great. For changing the opposite surface area between these electrodes, configurations or positions of these electrodes may be changed.

Similarly, the capacitance of the other capacitor $C_{12}$ can be controlled by changing the thickness of the third dielectric layer 26, the opposite surface area or the opposite distance between the second and the third capacitive open-circuited stub electrodes 22 and 24.

As experiments, measurements were carried out on the attenuation and reflectional loss of the embodiment and a comparison example wherein each parallel resonance frequency is not the frequency at the wavelength of $$\lambda = (2L\sqrt{\epsilon_r})/N$$

associated with each strip line electrode in the embodiment. The frequency characteristics of the embodiment and the comparison example are shown in FIG. 4 and FIG. 5, respectively.

Figure 4:
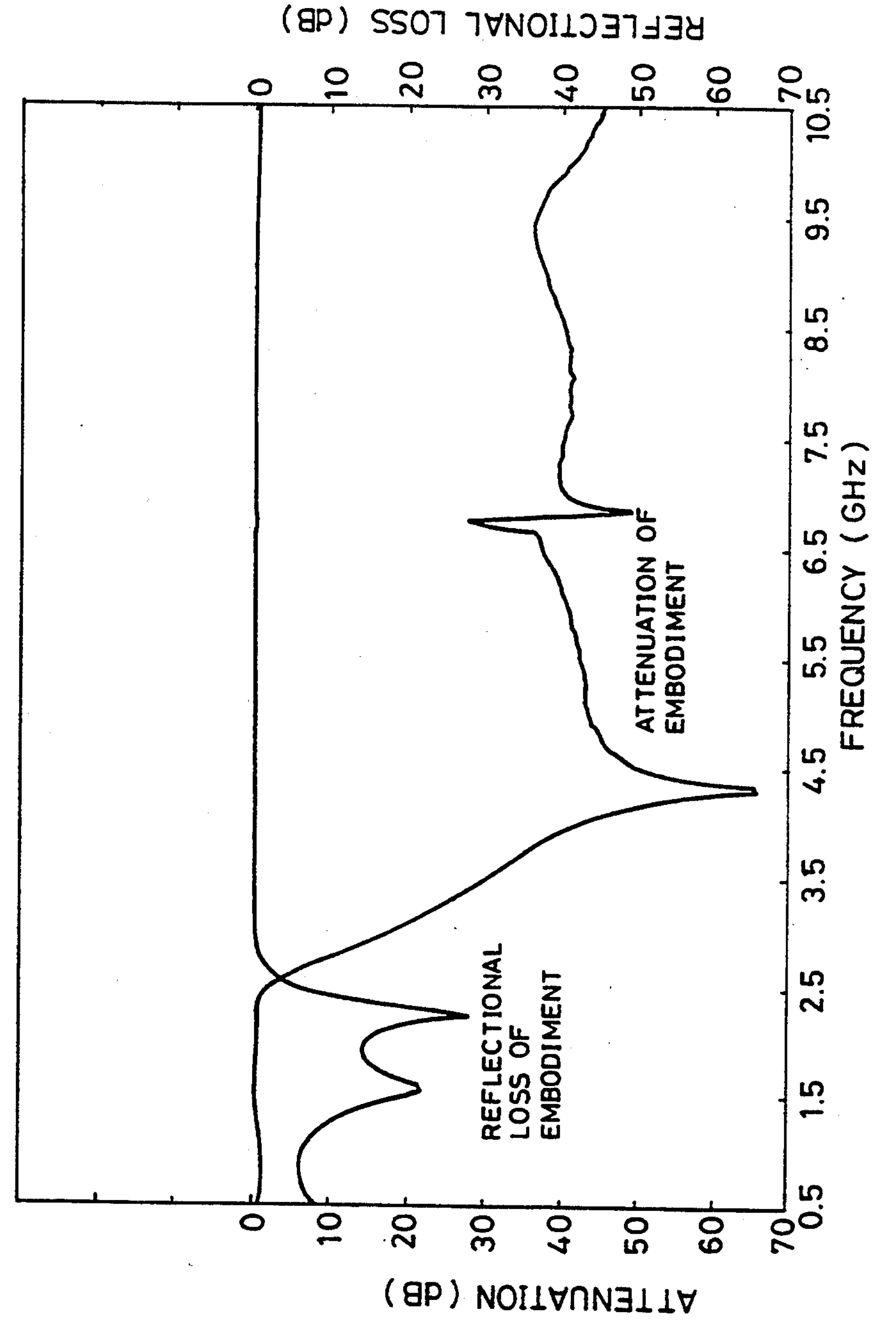
FIG. 4 is a graph showing the frequency characteristic of the high-frequency low-pass filter of FIG. 1.
Figure 5:
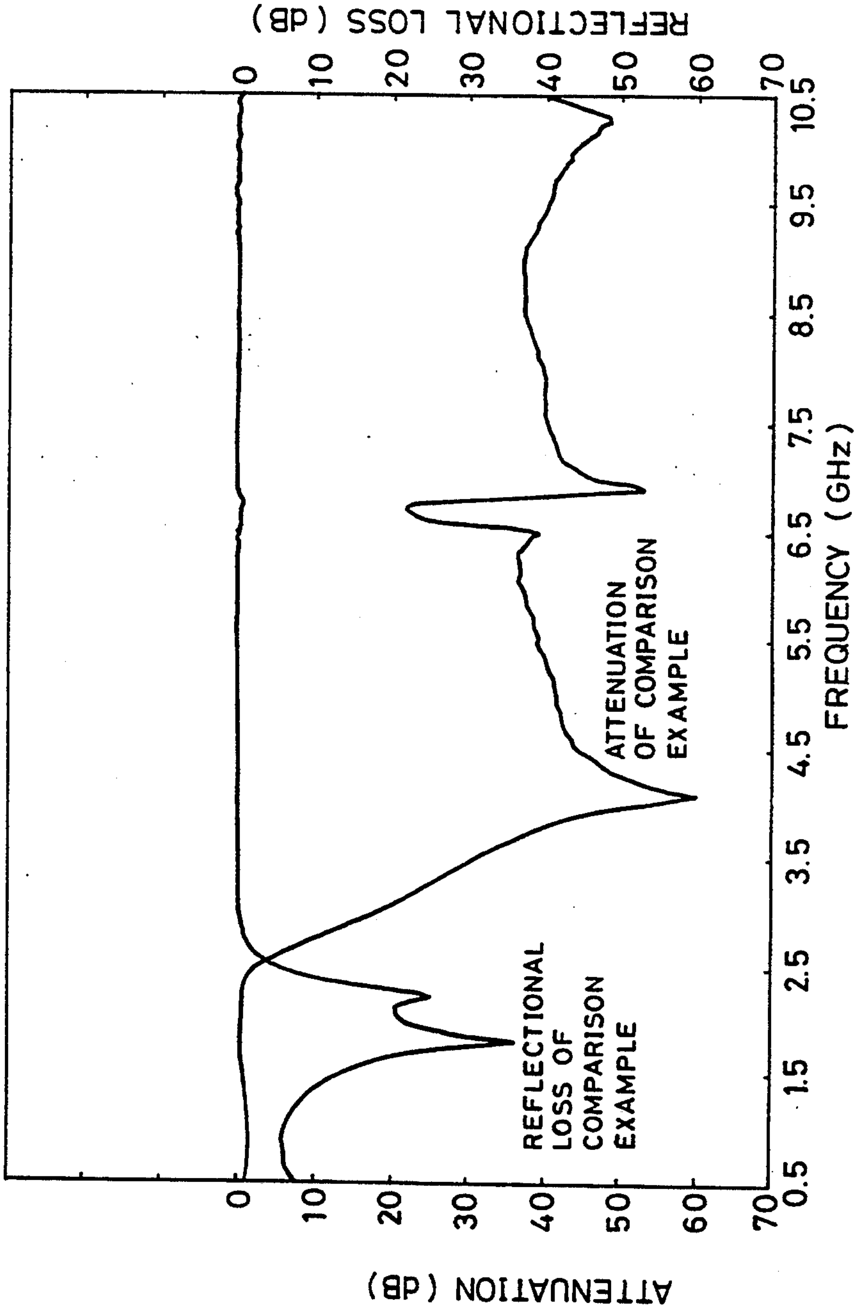
FIG. 5 is a graph showing a frequency characteristic of a comparison example.

As apparent from the graphs shown in FIG. 4 and FIG. 5, while the comparison example has an unnecessary passband which deteriorated the spurious characteristic about 6.8 GHz, such an unnecessary passband is suppressed and the spurious characteristic becomes good in the embodiment.

As mentioned above, when the parallel resonance frequency between the inductor and the capacitor is approximately equal to the frequency at the wavelength $$\lambda = 2L\sqrt{\epsilon_r}$$

associated with the strip line electrode, an unnecessary passband in the frequency at the wavelength $$\lambda = (2L\sqrt{\epsilon_r}/N$$

associated with a strip line electrode is suppressed, the spurious characteristic becomes good.

In the above-mentioned embodiment, the electrodes 20, 22 and 24 form a notch filter in the frequency at $\frac{1}{4}$ wavelength of the length thereof, and an attenuation pole is generated in the frequency range. Thus, when these frequencies are shifted into an integral time cutoff frequency, the attenuation by higher harmonic of the cutoff frequency can be increased.

Also, though the above-mentioned embodiment has two sets of parallel resonance circuits consisting of two inductor and two capacitors, the present invention is applied to a high-frequency low-pass filter having one, three or more parallel resonance circuits. In this case, the parallel resonance frequency between the inductor of the strip line electrode and the capacitor may be approximately equal to the frequency on the wavelength of $$\lambda = 2L\sqrt{\epsilon_r}$$

associated with the strip line electrode wherein L is the line length of the strip line electrode, and $\epsilon_r$ is the relative dielectric constant around the strip line electrode.

Figure 6:
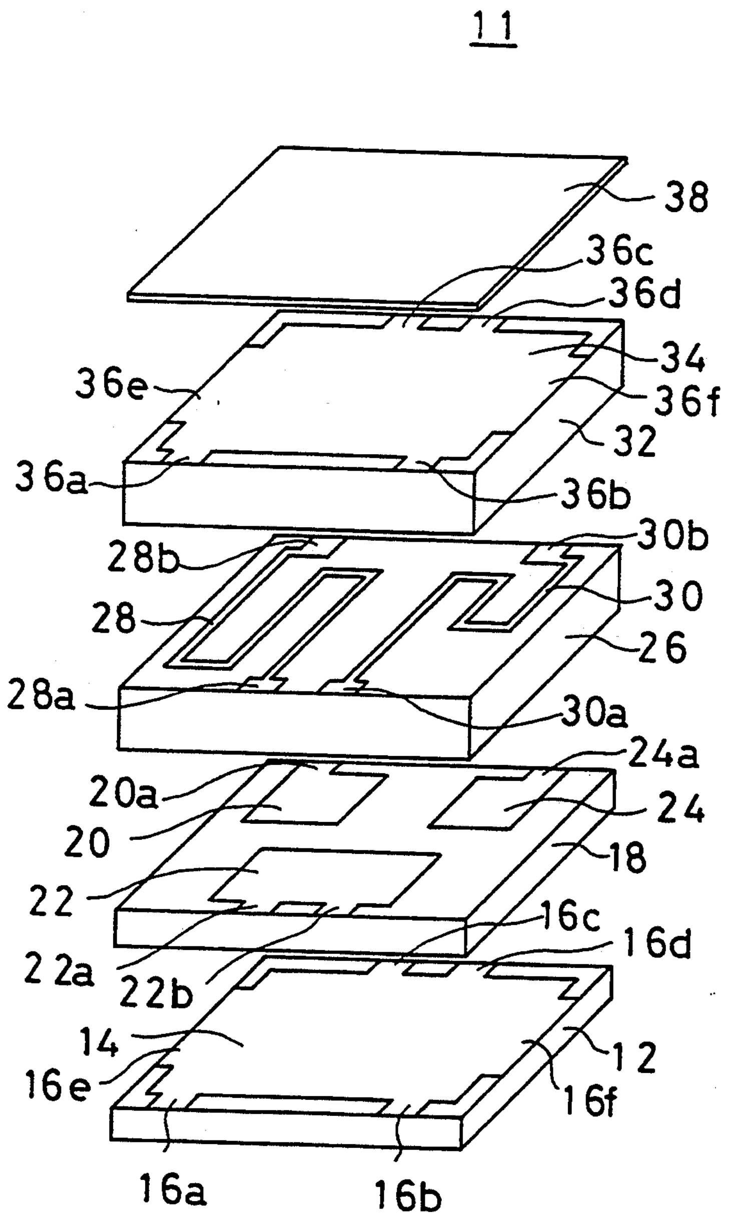
FIG. 6 is an exploded perspective view showing a laminate of another embodiment of the present invention.

FIG. 6 is an exploded perspective view showing a laminate of another embodiment of the present invention. Compared with the embodiment shown in FIGS. 1–4, in the embodiment shown in FIG. 6, the length of the first strip line electrode 28 is different from that of the second strip line electrode 30.

In the embodiment, the capacitor $C_{11}$ produces an unnecessary resonance point in a high frequency band which is the resonance frequency associated with the first inductor $L_1$. Similarly, the capacitor $C_{12}$ produces an unnecessary resonance point in a high-frequency band which is the resonance frequency associated with the second inductor $L_2$.

In this embodiment, the length of the first strip line electrode 28 is different from that of the second strip line electrode 30. Consequently, there is a difference between the capacitance of the capacitors $C_{11}$ and $C_{12}$. As a result, the frequencies at the resonance points have divergence and thus the resonance points do not overlap with each other in the same frequency. Accordingly, the generation of a spurious response can be suppressed to some degree.

As experiments, measurements were carried out on the attenuation and reflectional loss of high-frequency low-pass filters in which the difference between the length of the first strip line electrode 28 and that of the second strip line electrode 30 is 0 $\mu$m, 50 $\mu$m, 100 $\mu$m, and 200 $\mu$m, 300 $\mu$m, and 400 $\mu$m. The frequency characteristics of the high-frequency low-pass filters are shown in FIG. 7 through FIG. 12.

Figure 7:
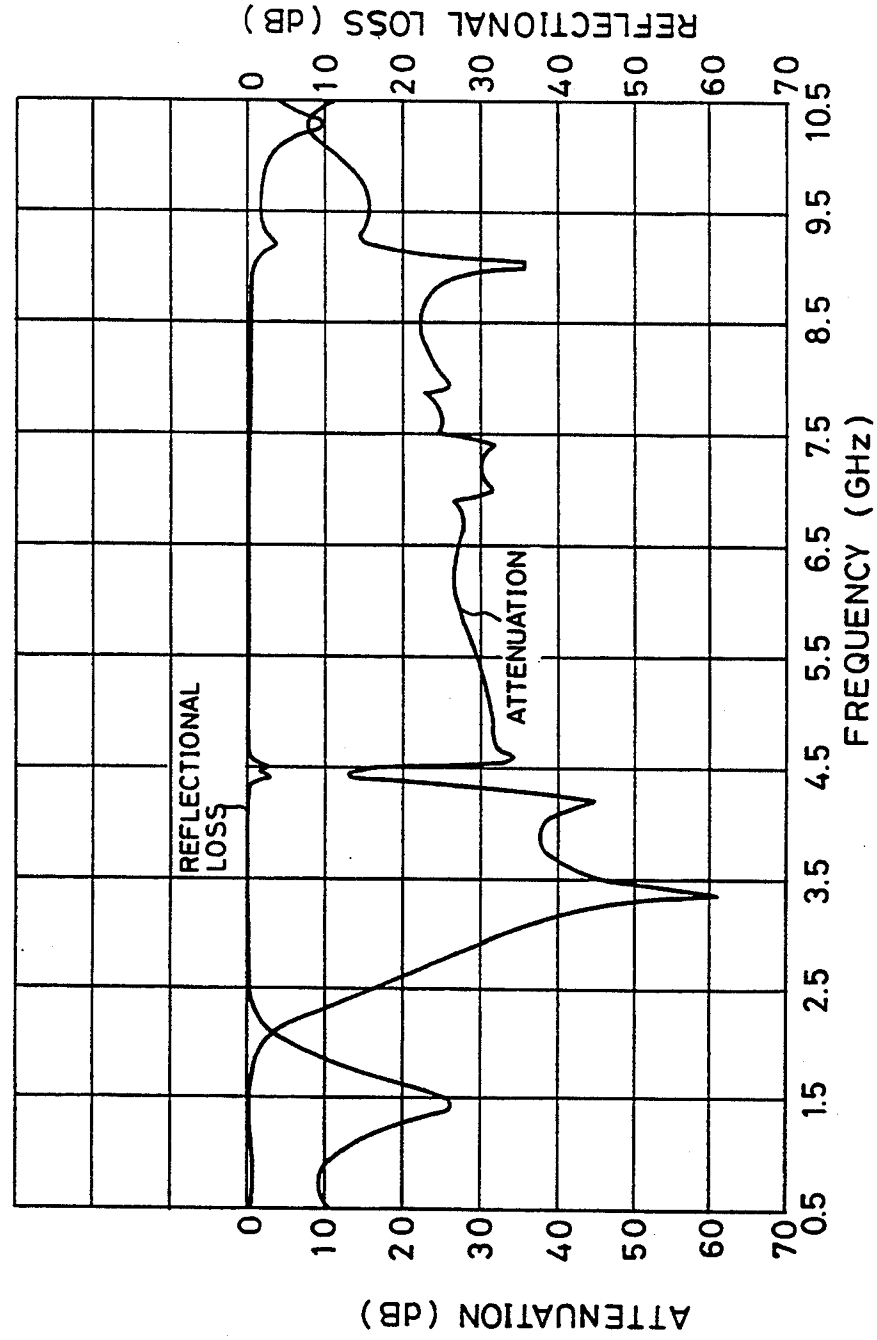
FIG. 7 is a graph showing the frequency characteristic of a high-frequency low-pass filter obtained when the difference between the length of a first strip line electrode and that of a second strip line electrode is 0 μm.
Figure 8:
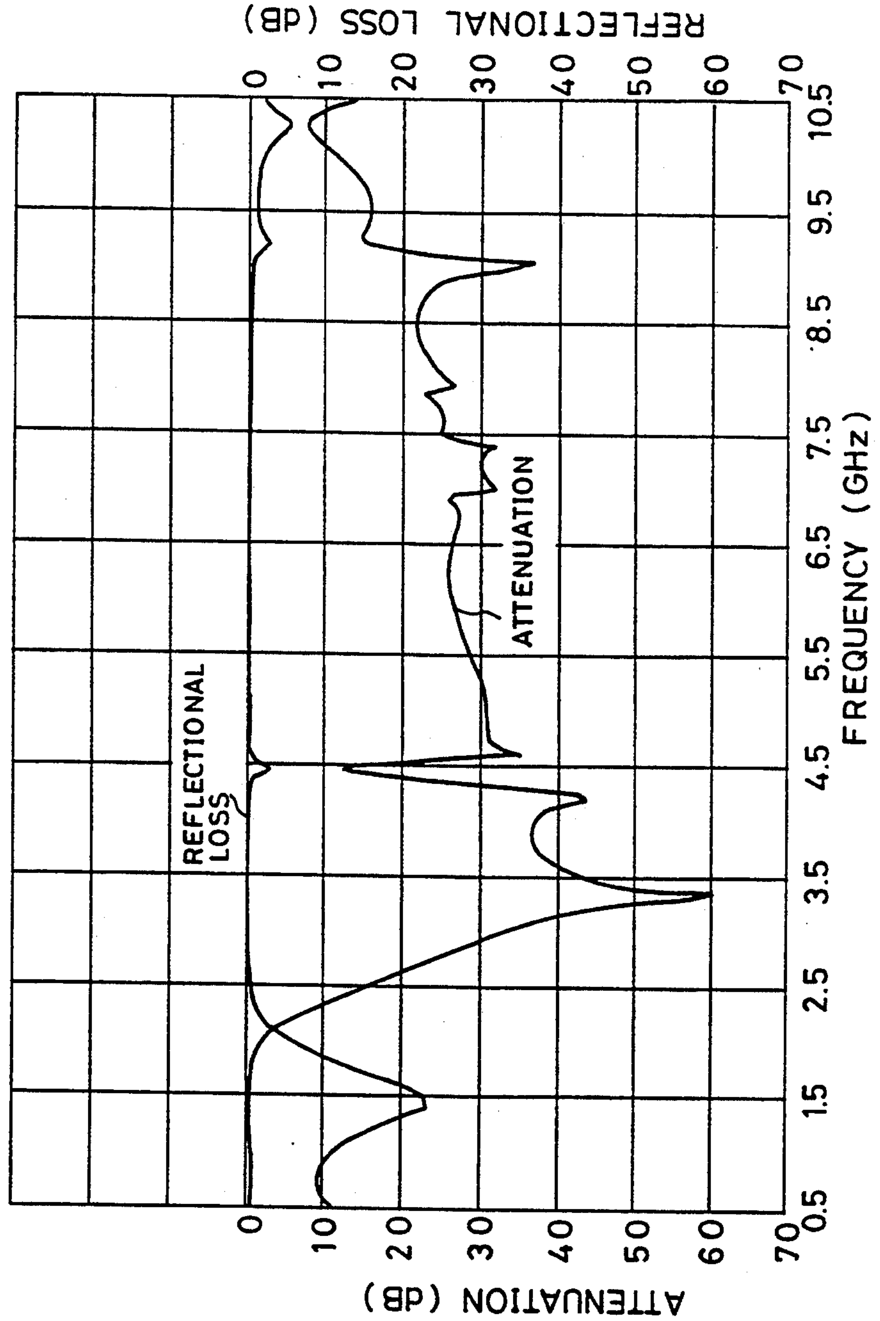
FIG. 8 is a graph showing the frequency characteristic of a high-frequency low-pass filter obtained when the difference between the length of the first strip line electrode and that of the second strip line electrode is 50 μm.
Figure 9:
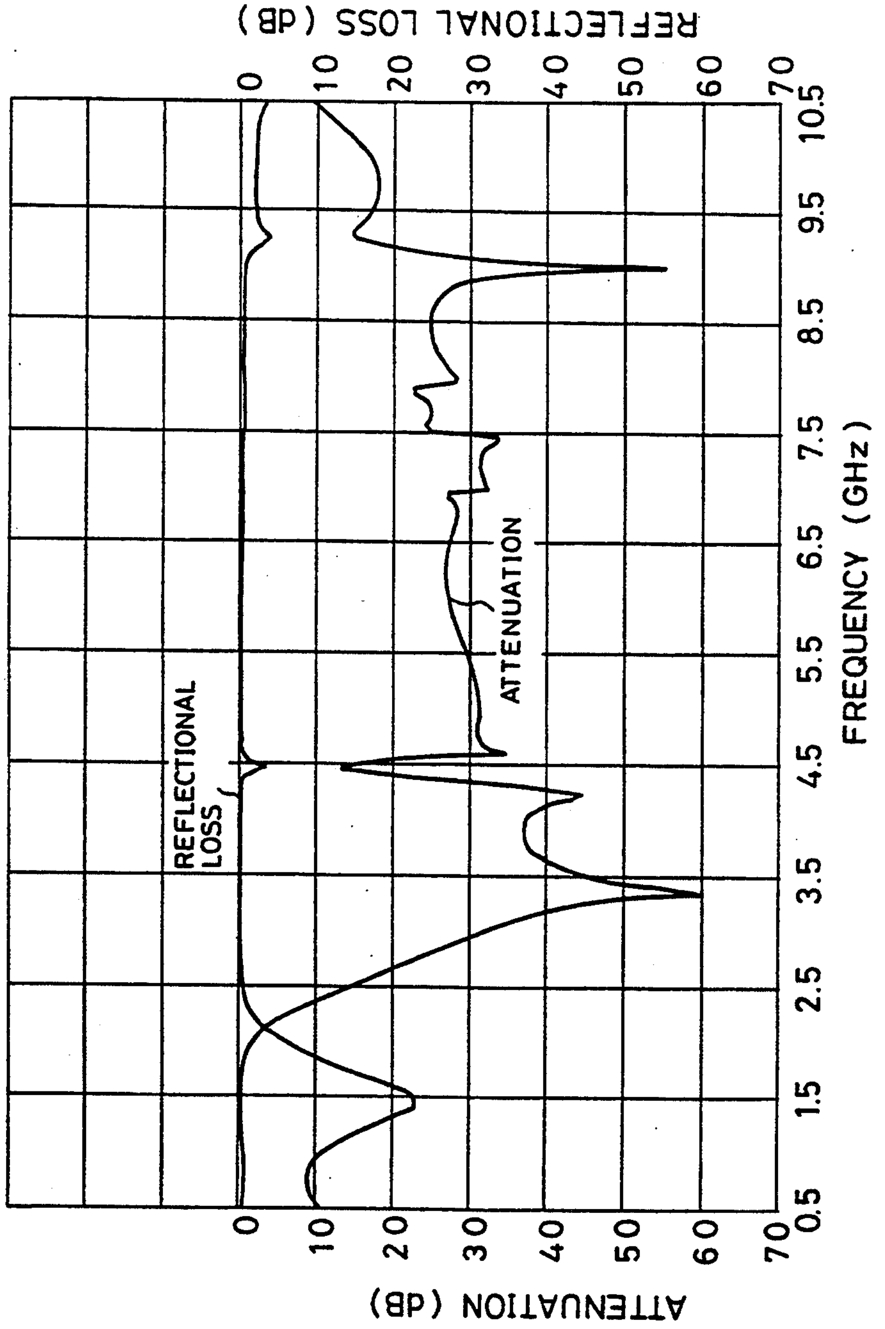
FIG. 9 is a graph showing the frequency characteristic of a high-frequency low-pass filter obtained when the difference between the length of the first strip line electrode and that of the second strip line electrode is 100 μm.
Figure 10:
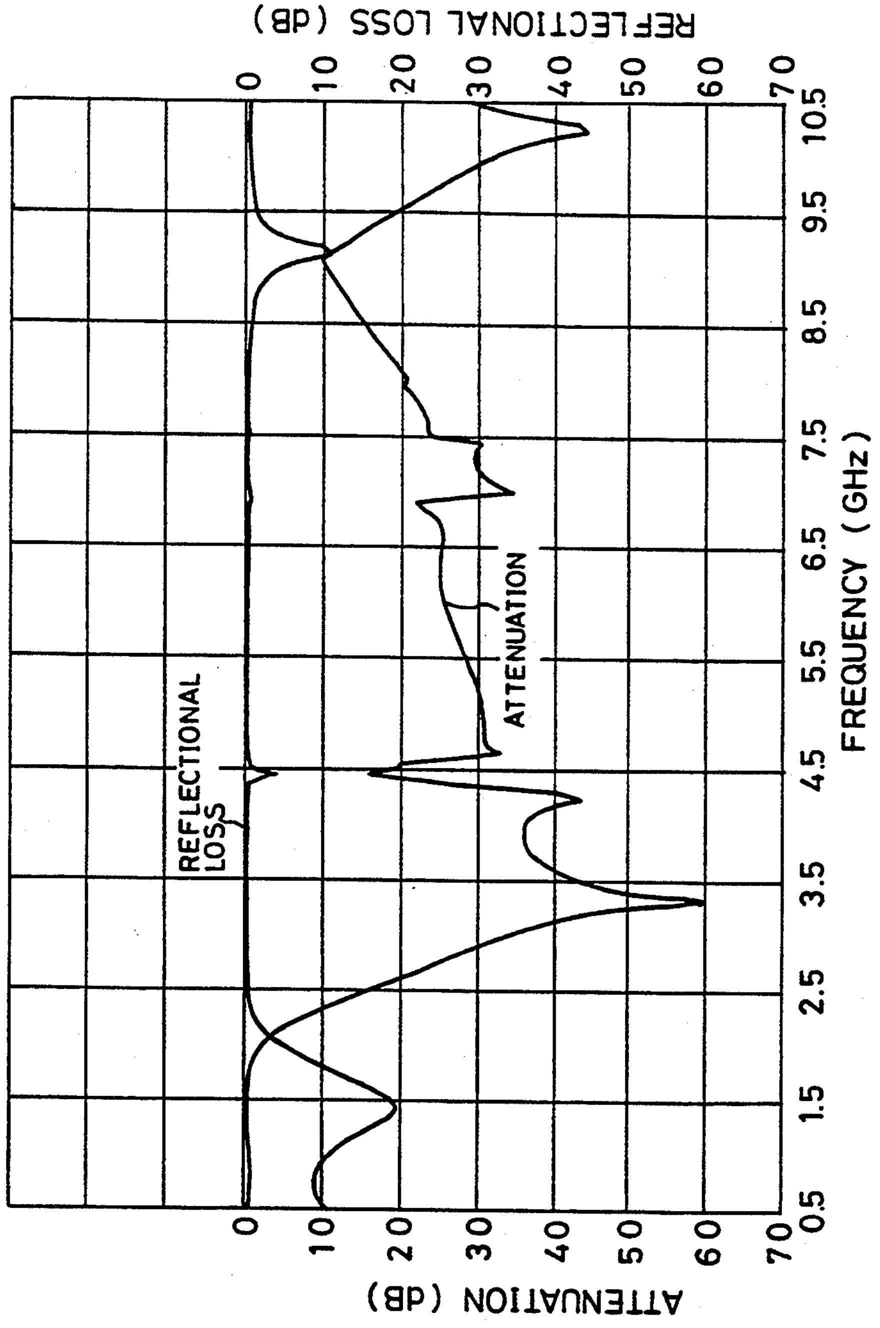
FIG. 10 is a graph showing the frequency characteristic of a high-frequency low-pass filter obtained when the difference between the length of the first strip line electrode and that of the second strip line electrode is 200 μm.
Figure 11:
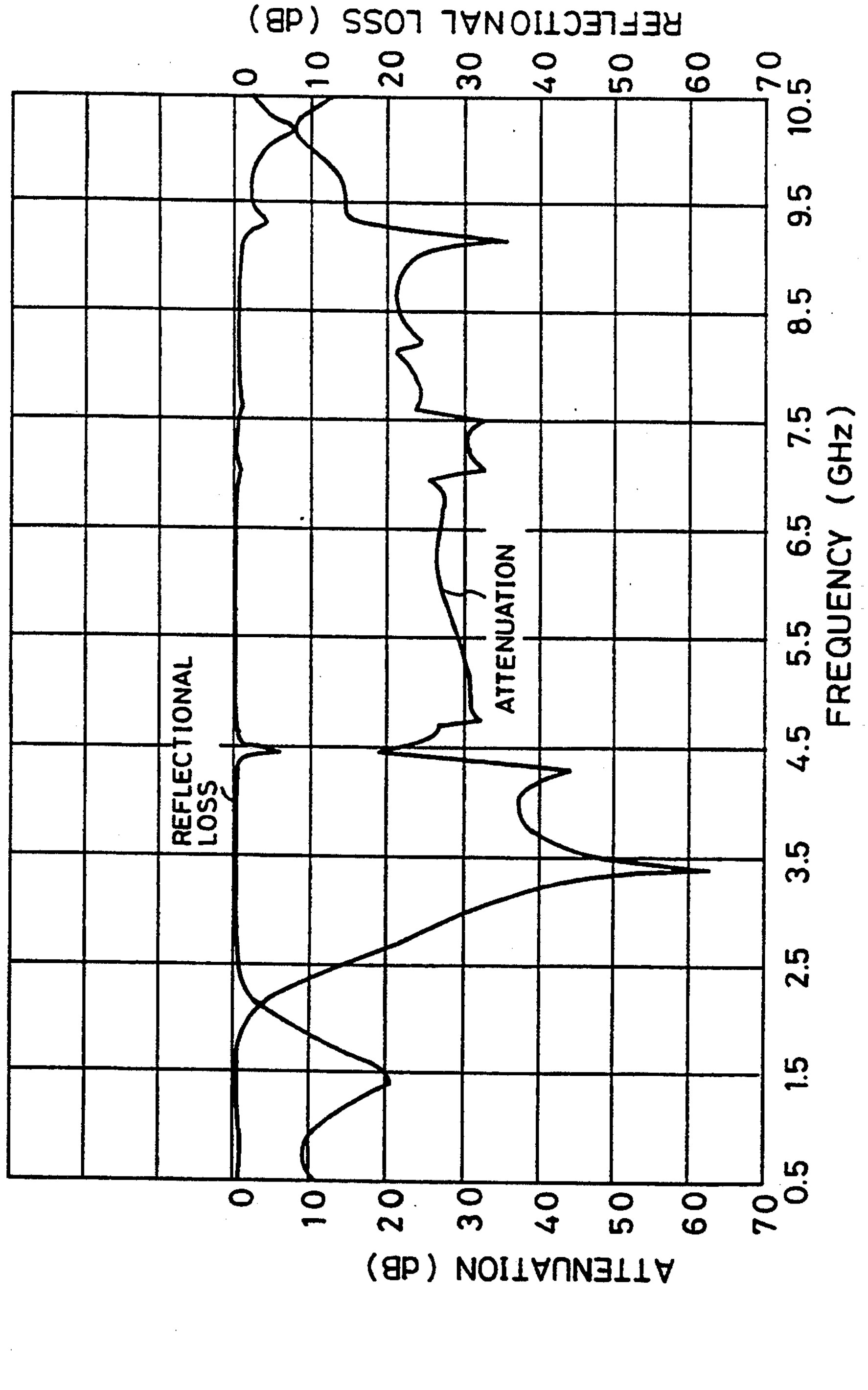
FIG. 11 is a graph showing the frequency characteristic of a high-frequency low-pass filter obtained when the difference between the length of the first strip line electrode and that of the second strip line electrode is 300 μm.

In the high-frequency low-pass filter in which the difference between the length of the first strip line electrode 28 and that of the second strip line electrode 30 is 0 μm, the attenuation becomes approximately 14 dB at a frequency of approximately 4.4 GHz as shown in FIG. 7.

Figure 12:
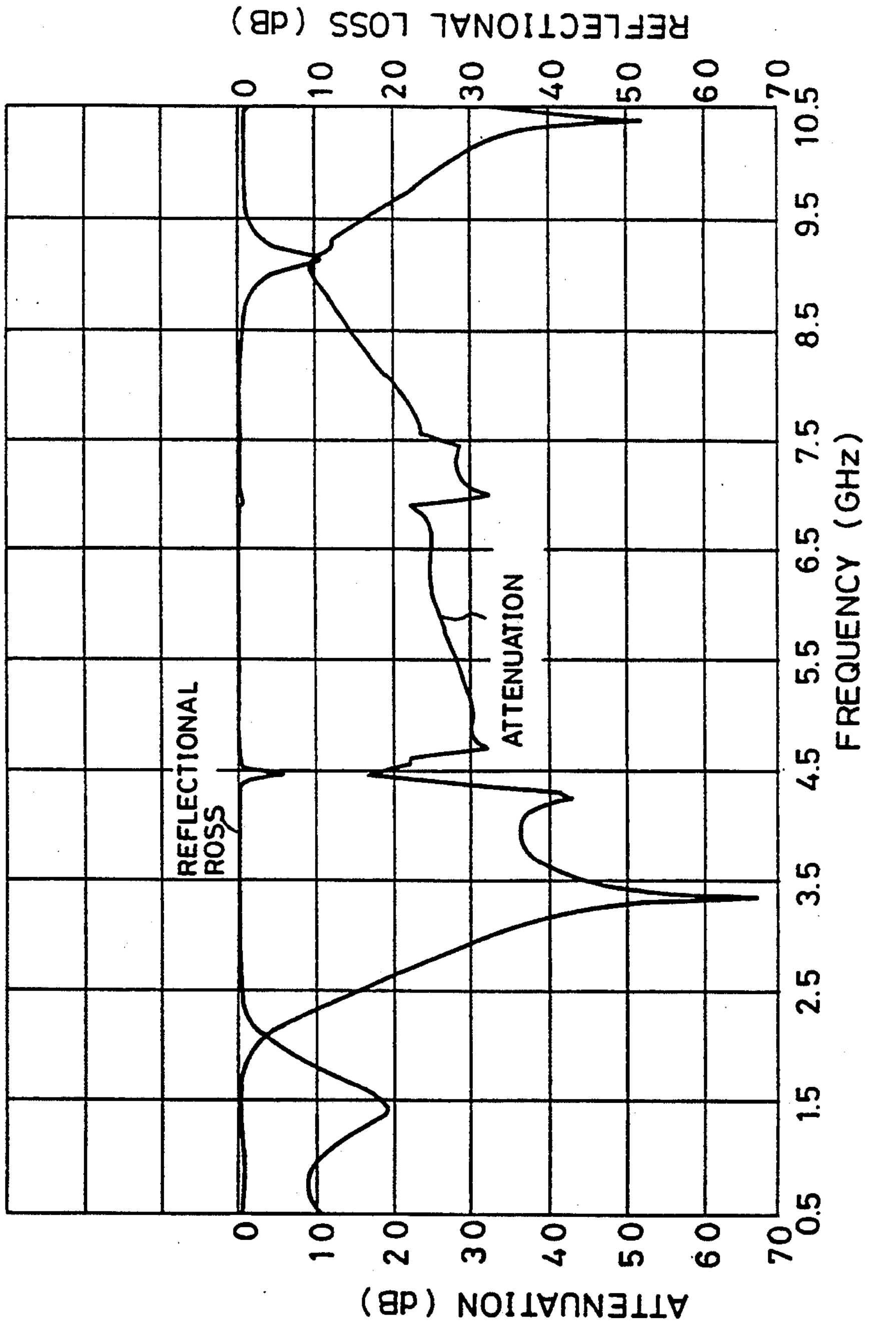
FIG. 12 is a graph showing the frequency characteristic of a high-frequency low-pass filter obtained when the difference between the length of the first strip line electrode and that of the second strip line electrode is 400 μm.

In the high-frequency low-pass filter in which the difference between the length of the first strip line electrode 28 and that of the second strip line electrode 30 is 40 μm, the attenuation becomes approximately 17 dB at a frequency of approximately 4.4 GHz as shown in FIG. 12.

As is apparent from the above description, a frequency characteristic having a small amount of spurious response can be obtained by differentiating the length of the first strip line electrode 28 from that of the second strip line electrode 30.

Figure 13:
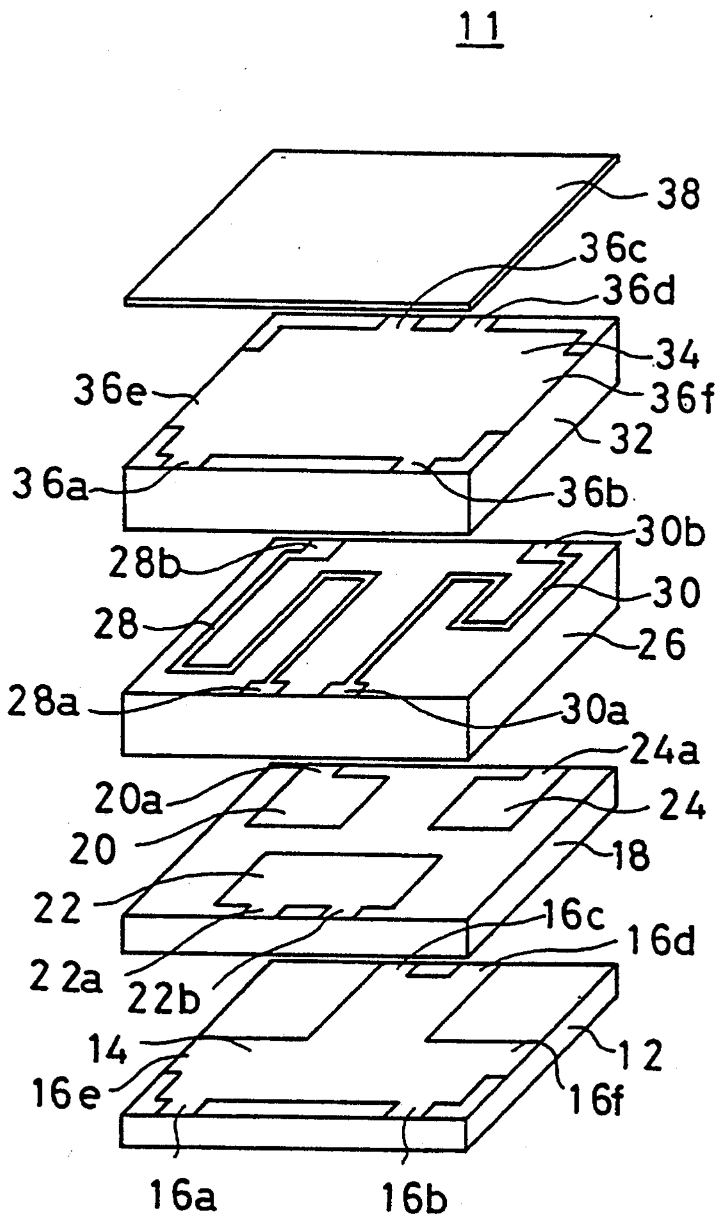
FIG. 13 is an exploded perspective view showing a modified example of the laminate shown in FIG. 6.
Figure 14:
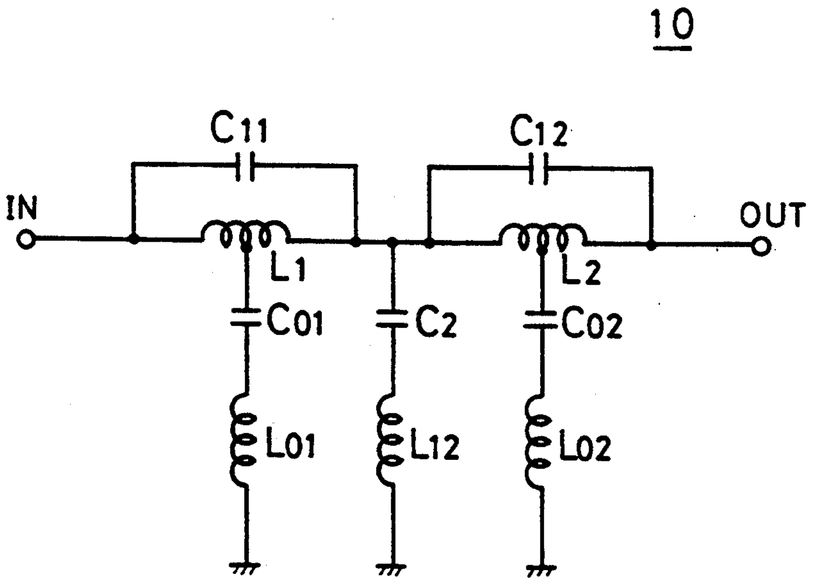
FIG. 14 is an equivalent circuit diagram of the high-frequency low-pass filter comprising the laminate shown in FIG. 13.
Figure 15:
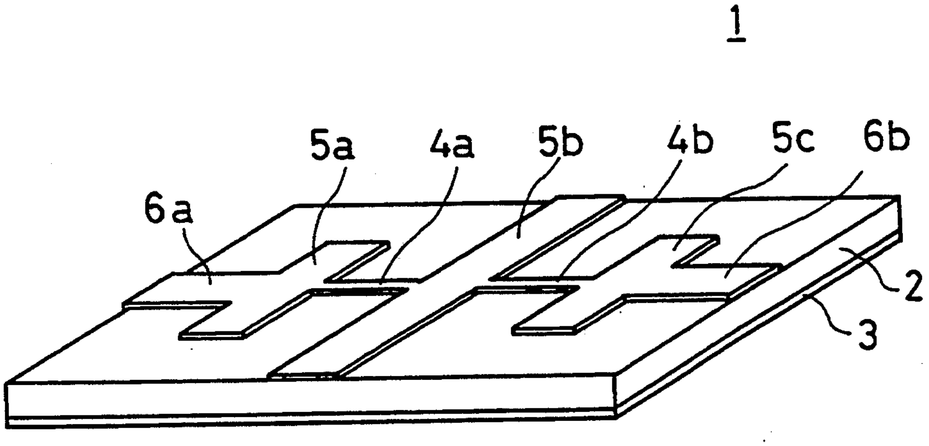
F I G.15 PRIOR ART
FIG. 15 is a perspective view showing an example of a conventional high-frequency low-pass filter.
Figure 16:
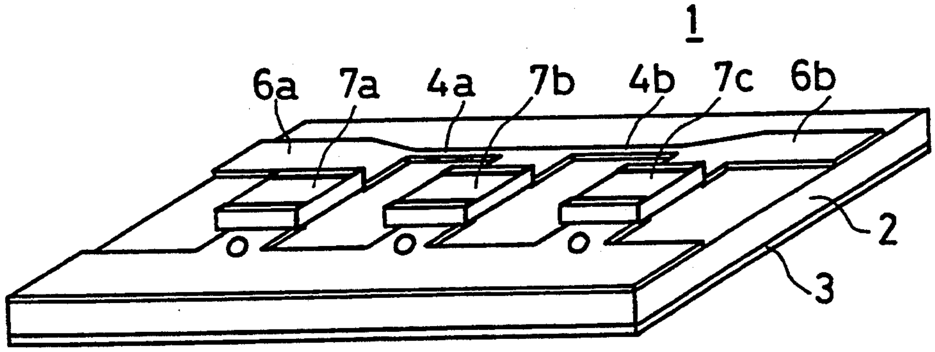
F I G.16 PRIOR ART
FIG. 16 is a perspective view showing another example of a conventional high-frequency low-pass filter.
Figure 17:
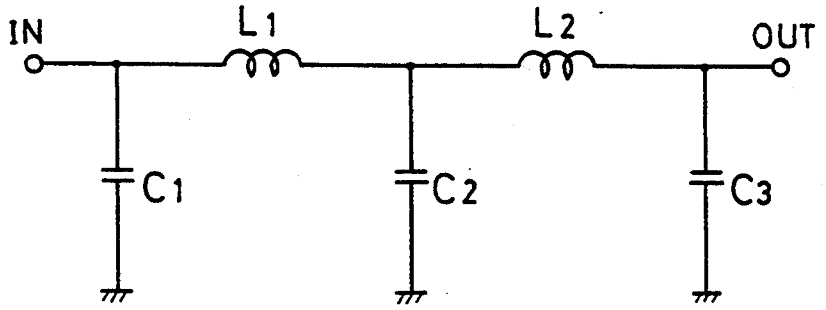
F I G. 17 PRIOR ART
FIG. 17 is an equivalent circuit diagram of the conventional examples shown in FIG. 15 and FIG. 16 in a form of a concentrated constant.

FIG. 13 is an exploded perspective view showing a modified example of the laminate shown in FIG. 6. FIG. 14 is an equivalent circuit diagram of the high-frequency low-pass filter shown in FIG. 13. Compared with the embodiment shown in FIG. 6, in the embodiment shown in FIG. 13, the earth electrode 14 is not opposite to the first capacitive open-circuited stub electrode 20 and the third capacitive open-circuited stub electrode 24, and the capacitors $C_1$ and $C_3$ are not formed. It is possible that the capacitors $C_1$ and $C_3$ are not formed. Similarly, in the embodiment shown in FIG. 1 through FIG. 4, it is possible that the capacitors $C_1$ and $C_3$ are not formed.

In order to differentiate the capacitance to be formed between the first strip line electrode 28 and other electrodes from the capacitance to be formed between the second strip line electrode 30 and other electrodes, the width of the first strip line electrode 28 and that of the second strip line electrode 30 may be differentiated from each other instead of differentiating the length of the first strip line electrode 28 and that of the second strip line electrode 30 from each other. That is, the opposite area between the first strip line electrode 28 and the other electrodes is different from the opposite area between the second strip line electrode 30 and the other electrodes by differentiating the width of the first strip line electrode 28 from that of the second strip line electrode 30. As a result, the capacitance to be formed between the first strip line electrode 28 and the other electrodes is different from the capacitance to be formed between the second strip line electrode 30 and the other electrodes. Furthermore, in each of the embodiments, it is possible to adjust the capacitance by changing the opposite distance between the strip line electrode and the capacitive open-circuited stub electrode.

In the embodiments shown in FIG. 6 through FIG. 13, the high-frequency low-pass filter has two strip line electrodes, but it may comprise three or more strip line electrodes. In this case, the surface areas of all strip line electrodes are differentiated from each other.

As described above, the high-frequency low-pass filter is as small as 5.7 mm×5.0 mm×2.0 mm and has a small spurious response. In addition, in the high-frequency low-pass filter of the present invention, insertion loss in a passband is less than 0.6 dB and the attenuation more than 20 dB can be secured in the range from the passband until 9 GHz.

In the present invention, a microstrip line electrode may be used as a strip line electrode.

It will be apparent from the foregoing that, while the present invention has been described in detail and illustrated, these are only particular illustrations and examples and the invention is not limited to these, the spirit and scope of the invention is limited only by the appended claims.

What is claimed is:

1. A laminated high-frequency low-pass filter comprising:

- a first dielectric layer;
- an earth electrode formed on said first dielectric layer;
- a second dielectric layer connected to said first dielectric layer such that said earth electrode is disposed between said first and second dielectric layers;
- a first and a second capacitive open-circuit stub electrode formed on said second dielectric layer;
- a third dielectric layer connected to said first and second dielectric layers;
- a strip line electrode comprising an inductor and being formed on said third dielectric layer, said strip line electrode having first and second ends;
- a first connector connecting said first capacitive open-circuit stub electrode and said first end of said strip line electrode;
- a second connector connecting said second capacitive open circuit stub electrode and said second end of said strip line electrode;
- a capacitor formed by said strip line electrode, said first and second capacitive open-circuit stub electrodes and said first and second connectors, said first and second connectors connecting said capacitor and said inductor in parallel;
- wherein a parallel resonance frequency between said inductor and said capacitor is approximately equal to the frequency at the wavelength $$\lambda = 2L\sqrt{\epsilon_r}$$

wherein L is a line length of said strip line electrode, and $\epsilon_r$ is a relative dielectric constant around said strip line electrode.

2. A high-frequency low-pass filter according to claim 1, wherein said strip line electrode is a first strip line electrode, said capacitor is a first capacitor and said inductor is a first inductor, said filter further comprising:

- a second strip line electrode comprising a second inductor and formed on said third dielectric layer, said second strip line electrode having first and second ends;
- a third capacitive open-circuit stub electrode formed on said second dielectric layer;
- a third connector connecting said first end of said second strip line electrode with said first capacitive open-circuit stub electrode;
- a fourth connector connecting said second end of said second strip line electrode with said third capacitive open-circuit stub electrode;
- a second capacitor formed by said second strip line electrode, said first and third capacitive open-circuit stub electrodes and said third and fourth connectors, said third and fourth connectors connecting said second capacitor and said second inductor in parallel; wherein a parallel resonance frequency between said second inductor and said second capacitor is approximately equal to the frequency at the wavelength $$\lambda = 2L\sqrt{\epsilon_r}$$

wherein L is a line length of said second strip line electrode, and $\epsilon_r$ is a relative dielectric constant around said second strip line electrode.

3. A high-frequency low-pass filter according to claim 2, which further comprises a fourth dielectric layer formed on and operatively connected to said third dielectric layer such that said first and second strip line electrodes are disposed between said third dielectric layer and said fourth dielectric layer; and a shield electrode formed on and operatively connected to said fourth dielectric layer.

4. A high-frequency low-pass filter according to claim 3, which further comprises a fifth dielectric layer formed on and operatively connected to said fourth dielectric layer such that said shield electrode is disposed between said fourth dielectric layer and said fifth dielectric layer.

5. A laminated high-frequency low-pass filter comprising:

a first dielectric layer;

an earth electrode formed on said first dielectric layer;

a second dielectric layer formed on and operatively connected to said first dielectric layer such that said earth electrode is located between said first dielectric layer and said second dielectric layer;

a plurality of capacitive open-circuited stub electrodes formed on said second dielectric layer and located opposite to said earth electrode;

a third dielectric layer formed on and operatively connected to said second dielectric layer such that said plurality of capacitive open-circuited stub electrodes are located between said second dielectric layer and said third dielectric layer; and two strip line electrodes each comprising an inductor, formed on said third dielectric layer and connected to said plurality of capacitive open-circuited stub electrodes to form a plurality of capacitors connected in parallel with said inductors, wherein surface areas of said two strip line electrodes are different from each other.

6. A high-frequency low-pass filter according to claim 5, wherein the lengths of said two strip line electrodes are different from each other.

7. A high-frequency low-pass filter according to claim 5, which further comprises a fourth dielectric layer formed on said third dielectric layer and sandwiching said two strip line electrodes between said third dielectric layer and said fourth dielectric layer; and a shield electrode formed on said fourth dielectric layer.

8. A high-frequency low-pass filter according to claim 7, which further comprises a fifth dielectric layer formed on said fourth dielectric layer and sandwiching said shield electrode between said fourth dielectric layer and said fifth dielectric layer.

9. A high-frequency low-pass filter according to claim 6, which further comprises a fourth dielectric layer formed on said third dielectric layer and sandwiching said two strip line electrodes between said third dielectric layer and said fourth dielectric layer; and a shield electrode formed on said fourth dielectric layer.

10. A high-frequency low-pass filter according to claim 9, which further comprises a fifth dielectric layer formed on said fourth dielectric layer and sandwiching said shield electrode between said fourth dielectric layer and said fifth dielectric layer.

* * * * *